United States Patent [19]

Fletcher et al.

[11] Patent Number: 5,541,562

[45] Date of Patent: Jul. 30, 1996

[54] APPARATUS FOR SENSING THE CLOSURE OF A DOOR

[75] Inventors: Thomas A. Fletcher; Timothy S. Whalen, both of Stephenson, Ill.

[73] Assignee: Honeywell Inc., Minneapolis, Minn.

[21] Appl. No.: 319,343

[22] Filed: Oct. 16, 1994

[51] Int. Cl.$^6$ .................................................. H01H 9/00
[52] U.S. Cl. .......................................... 335/205; 335/207
[58] Field of Search ........................................ 335/205–7

[56] References Cited

U.S. PATENT DOCUMENTS

| | | |
|---|---|---|
| 4,199,741 | 4/1980 | Serrus Paulet . |
| 4,210,889 | 7/1980 | Holce . |
| 4,319,712 | 3/1982 | Bar .......................................... 335/205 |
| 4,349,814 | 9/1982 | Akehurst . |
| 4,580,062 | 4/1986 | MacLaughlin . |
| 4,812,674 | 3/1989 | Sue et al. . |
| 4,945,340 | 7/1990 | Brill . |
| 5,233,323 | 8/1993 | Burkett et al. ........................... 335/207 |

*Primary Examiner*—Lincoln Donovan
*Attorney, Agent, or Firm*—William D. Lanyi

[57] ABSTRACT

An enclosure sensing apparatus is provided which monitors the movement of a key structure relative to a housing structure. The purpose of the device is to determine that a moveable object has moved into an appropriate position relative to a stationary object. First, second and third magnetically sensitive devices are provided within a housing structure. First and second magnets are attached to a key structure that is moveable relative to the housing structure and a third magnet is provided within the housing structure to advantageously affect the operation of the second magnetically sensitive device. Several positions of the key structure can be specifically identified as the key structure passes through a path provided within the housing structure. In addition, a latching mechanism is provided to lock the relative position of the key structure and the housing structure when the key structure has reached a preselect position relative to the housing structure.

16 Claims, 12 Drawing Sheets

APPARATUS FOR SENSING THE CLOSURE OF A DOOR

BACKGROUND OF THE INVENTION

1. Field of the Invention

The present invention is generally related to an interlock switch and, more specifically, to an apparatus for sensing the closure of a door as indicated by the insertion of a key structure into a housing structure.

2. Description of the Prior Art

In many types of machine tools, it is advantageous to provide a means for assuring that a protective enclosure is closed prior to permitting the operation of the equipment. In some instances, this closure sensing operation is necessary to protect the safety of the machine operator by preventing the operator from being endangered by moving components. In other applications of devices of this type, the enclosure sensing equipment is utilized to protect damage from occurring to one portion of the equipment by other portions of the equipment that could occur if the machine was operated without all of the intended protective components being in their proper place.

Several types of enclosure sensing devices are known to those skilled in the art. Typically, a moveable component is moved toward a stationary component and some means is provided to determine that the moveable component has properly been disposed at a predetermined position relative to the stationary component. In some instances, the proper position of the moveable component relative to the stationary component is merely detected by a signal provided by the sensing apparatus. In other cases, the provision of the output signal is accompanied by some type of mechanical means that rigidly latches the moveable component to the stationary component.

U.S. Pat. No. 4,580,062, which issued to MacLaughlin on Apr. 1, 1986, discloses a safety shield control device that provides an electrical interlock to prevent unauthorized access to potentially hazardous equipment. An associated detection circuit is provided to detect if a safety shield or closure member is opened, not securely closed or has been tampered with. The detection circuit comprises a balanced bridge incorporating the electrical interlock into a leg thereof and may also provide a visual or audible indication whether the bridge is unbalanced.

U.S. Pat. No. 4,210,889, which issued to Holce on Jul. 1, 1980, describes a magnetically actuating sensing device that is intended for use in security monitoring systems. A switch unit is provided with a plurality of electrically interconnected magnetic Reed switch that are disposed in a predetermined physical relationship in order to provide for controlling electrical circuits. Each Reed switch is biased in a magnetically actuated state by a permanent biasing magnet in close proximity thereto. The biasing magnets are arranged in a predetermined combination of plurality orientations. A corresponding number of permanent actuating magnets with plurality orientators opposing those of the biasing magnets are disposed within an actuating unit so that they overcome the effect of the biasing magnets when the switch unit and actuating unit are in a predetermined physical relationship with each other.

U.S. Pat. No. 4,349,814, which issued to Akehurst on Sep. 14, 1982, describes an electrical switch for use on machinery to prevent machine operation and less safety guards or the like are correctly positioned. It comprises two separate parts. One part includes at least two Hall effect devices which respond to magnetic poles of opposite polarity and electronic switching means which is actuated only when all of the Hall effect devices are triggered simultaneously. The other part of the device includes a corresponding number of magnets that are positioned to actuate the respective Hall effect devices when the two switch parts are placed in close proximity and predetermined orientation.

U.S. Pat. 4,812,674, which issued to Sue et al on Mar. 14, 1989, discloses a safety gate limit switch that uses Hall effect transducers. The proximity switch has at least three Hall effect magnetic field sensitive transducers that are mounted in a transducer housing and has at least two magnets mounted in a magnet housing. The transducers produce logic signals and a logic circuit responsive to those signals activates an electrical switch only when the magnets are in a proper position relative to the transducers. The electrical switch may be used to control a machine and the machine is not activated until the proximity switch is activated.

U.S. Pat. No. 4,945,340, which issued to Brill on Jul. 31, 1990, describes a taper resistant magnetic security system. The system is intended for use in a physical security monitoring environment and it includes a switch unit that has a common conductor, a guard conductor and at least three switches. Each of the switches has a deactivated condition and an activated condition and each is adapted to be placed in its activating condition in response to a magnetic field of predetermined magnetic flux. The switch unit also includes a logic circuit electrically interconnecting the switches and the common and guard conductors, the logic circuit completing a series circuit between the common conductor and the guard conductor whenever at least two predetermined but all switches are in magnetically actuated condition.

U.S. Pat. No. 4,199,741, which issued to Serrus Paulet on Apr. 22, 1980, discloses a moving magnet rotary switch that comprises a stationary body that is provided with longitudinal bores in each of which a core of magnetic material is moveable. It also comprises switching means located at one end of the bores which are adapted to be actuated by the cores and magnetic elements adapted to be brought successively opposite the ends of said bores to either displace or hold the cores in the bores for actuating the switching means.

SUMMARY OF THE INVENTION

A preferred embodiment of the present invention comprises a housing structure that has first, second and third magnetically sensitive devices disposed within it. The first, second and third magnetically sensitive devices are aligned along a first axis and the housing structure is shaped to form a first path into it. A key structure is provided with first and second magnets attached thereto. The first and second magnets are aligned along a second axis and the key structure is shaped to be received within the housing structure along the first path. A means is provided for determining a predetermined relative position relationship between the key structure and the housing.

In one preferred application of the present invention, the housing structure is attachable to a stationary portion of a machine or other type of equipment. The key structure is attached to a moveable portion of the machine, such as a protective door that prevents operator entry into a predetermined portion of the machine.

In a particularly preferred embodiment of the present invention, a third magnet is disposed proximate the first path within the housing structure. Also in a preferred embodiment of the present invention, a means is provided for monitoring the sequential movement of the key structure relative to the housing structure. In one embodiment of the present invention, the first, second and third magnetically sensitive devices are Hall effect components.

In a particularly preferred embodiment of the present invention the key structure is permitted to move along the first path in both a first direction and in a second direction within the housing structure. In order to facilitate the bi-directional operation of the present invention, a means is provided for exchanging the logical operation of the first and third magnetically sensitive devices within an electronic circuit. This exchanging means permits the movement of the key structure to be appropriately monitored in a preselected one of the two directions of movement of the key structure.

In a particularly preferred embodiment of the present invention, a means is provided for preventing movement of the key structure relative to the housing structure when the key structure is disposed in a preselected position relative to the housing structure.

BRIEF DESCRIPTION OF THE DRAWINGS

The present invention will be more fully understood from a reading of the Description of the Preferred Embodiment in conjunction with the drawings, in which.

DESCRIPTION OF THE PREFERRED EMBODIMENT

Figure 1A:
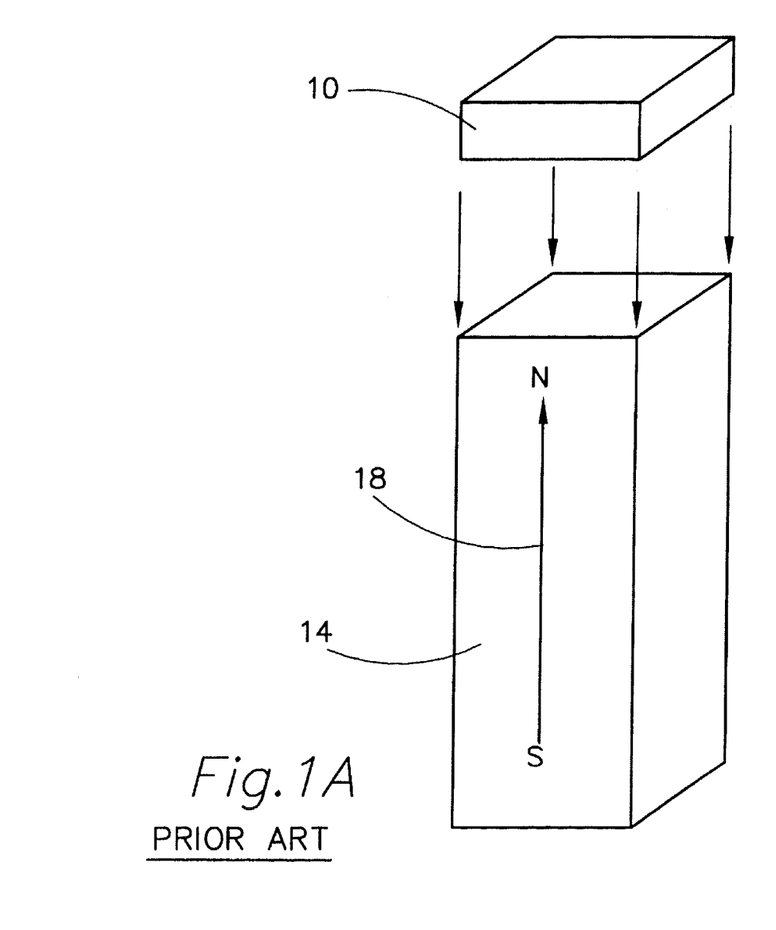
FIGS. 1A and 1B illustrate the basic operation of a Hall effect device and its intended location relative to a permanent magnet.
Figure 1B:
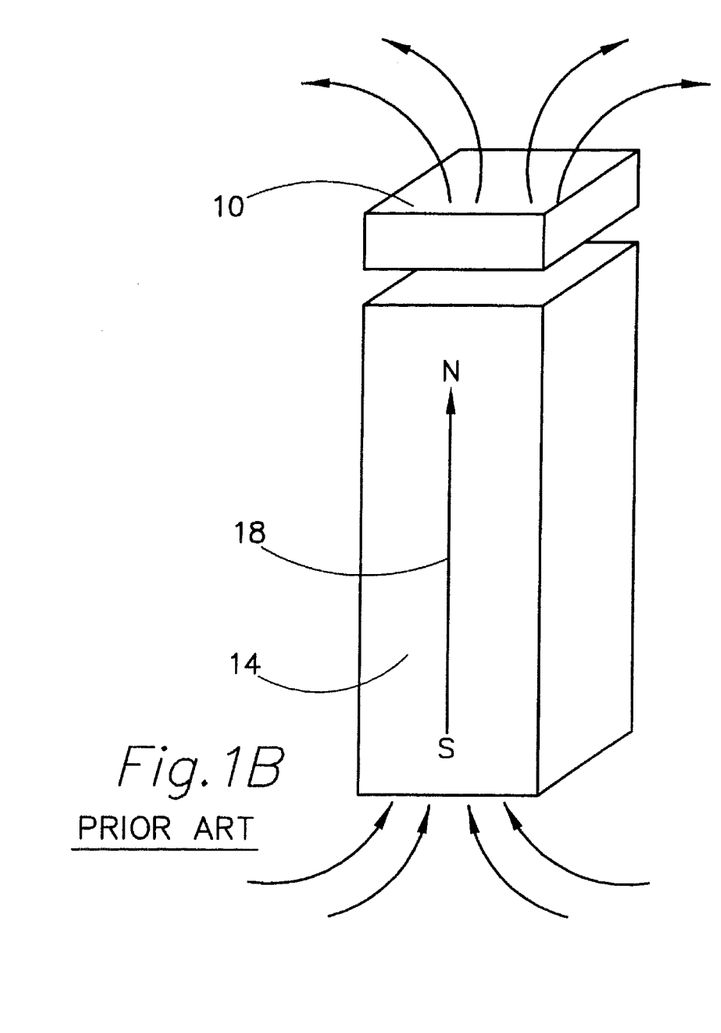

Throughout the Description of the Preferred Embodiment of the present invention, like components will be identified by like reference numerals. FIG. 1A shows a simplified schematic representation of a Hall effect element 10 and a permanent magnet 14. As is well known to those skilled in the art, Hall effect elements are sensitive to magnetic fields that extend in a direction perpendicular to their sensing plane. If a Hall effect element is disposed proximate a permanent magnet 14, as represented by the four arrows in FIG. 1A, it can be used to sense changes in the magnetic field emanating from the permanent magnet. FIG. 1B shows the lines of flux provided by the permanent magnet 14 and their passage through the Hall effect element 10. The component of the magnetic flux passing perpendicular to the sensing plane of the Hall effect element can be sensed. In FIGS. 1A and 1B, arrow 18 is used to represent the direction of the magnetic field emanating from the north pole of the permanent magnet. This convention will be utilized throughout the description of the present invention.

Figure 2A:
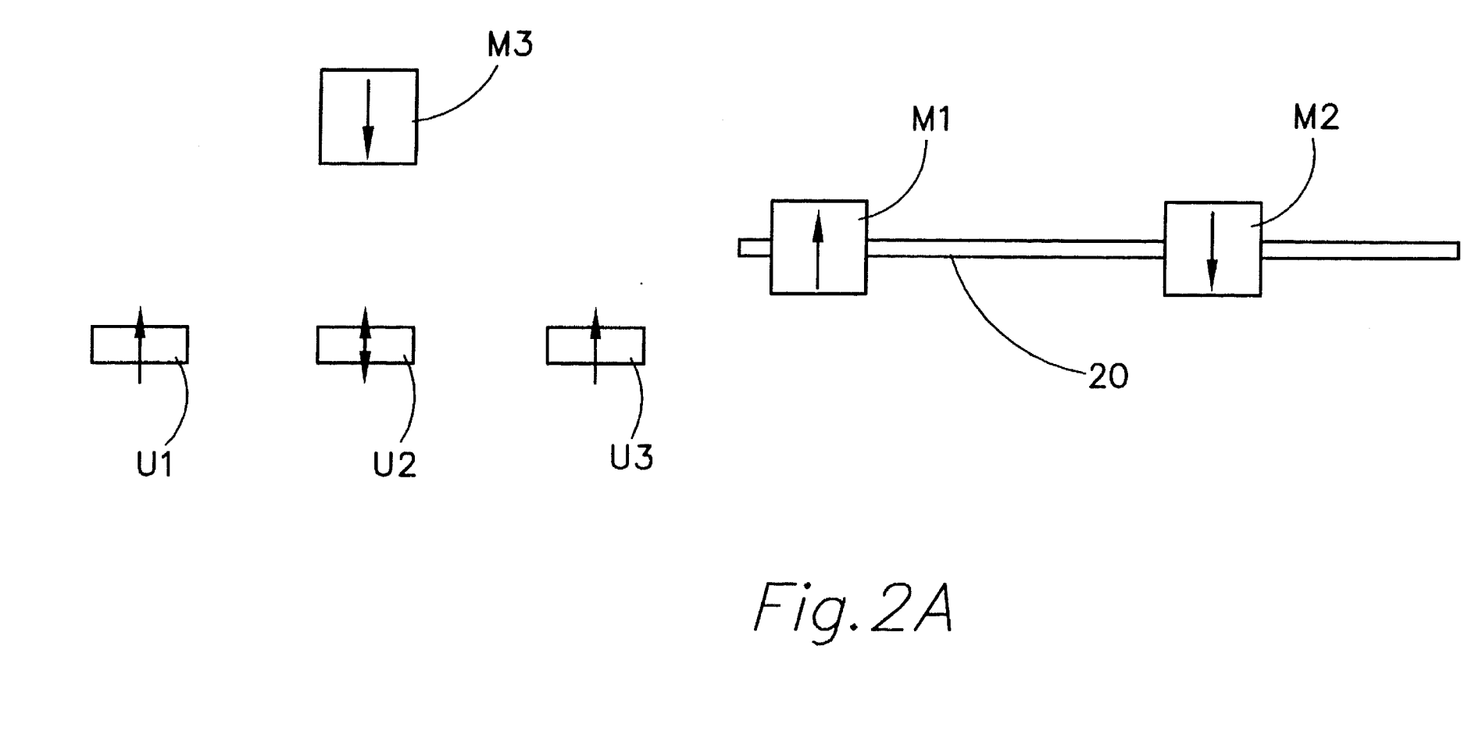
FIGS. 2A, 2B, 2C and 2D illustrate sequential relative positions of the key structure and the housing structure of the present invention.

FIG. 2A shows a schematic representation of the present invention and illustrates the relative positions of the magnetically sensitive components and the magnets utilized to perform the operation of the present invention. Although no housing structure is illustrated in FIG. 2A, it should be understood that the first magnetically sensitive device U1, the second magnetically sensitive device U2 and the third magnetically sensitive device U3 are intended to be contained within a housing structure. A key structure 20 is provided with a first magnet M1 and a second magnet M2. A third magnet M3 is provided within the housing structure as shown. The first, second and third magnetically sensitive devices and the third magnet are all contained within the housing structure which is stationary. The first magnet M1 and the second magnet M2 are attached to the key structure 20 which is moveable relative to the housing structure.

In FIG. 2A, the arrows represent the magnetic direction of the magnets as described above with reference to FIGS. 1A and 1B and the arrows associated with the magnetically sensitive components represent their direction of magnetic sensitivity. It should be noted that the first and third magnetically sensitive devices, U1 and U3, are uni-directional while the second magnetically sensitive device U2 is bi-directional. Although many different types of uni-directional and bi-directional magnetically sensitive devices can be used in association with the present invention, a particularly preferred embodiment utilizes a uni-polar digital position sensor that is identified by catalog listing SS443A and is commercially available from the Honeywell MICRO SWITCH division. In addition, a particularly preferred embodiment of the present invention utilizes a bi-polar position sensor identified by catalog listing SS413A which is available from the Honeywell's MICRO SWITCH division. These digital position sensors incorporate Hall effect technology and are well known to those skilled in the art.

With continued reference to FIG. 2A, it should be understood that as the key structure 20 moves from the right toward the left in the illustration, the first, second and third magnetically sensitive devices will be affected by the passage of the first and second magnets, M1 and M2, proximate to them. A path is defined above the first, second and third magnetically sensitive devices and below the third magnet M3.

Although many different configurations of magnetically sensitive devices can be employed in association with the present invention, for purposes of describing the operation of the device the magnetically sensitive devices will be assumed to provide a high output when they are unaffected by a magnetic field and to provide a low output when they are affected by a magnetic field. Because of the presence of the third magnet M3, the second magnetically sensitive device U2 will provide a signal when no key structure is present within the housing structure. The first and third magnetically sensitive devices will not provide a signal. Therefore, the outputs from magnetically sensitive devices U1, U2 and U3 will be "101" when no key structure 20 is present within the housing structure.

Figure 2B:
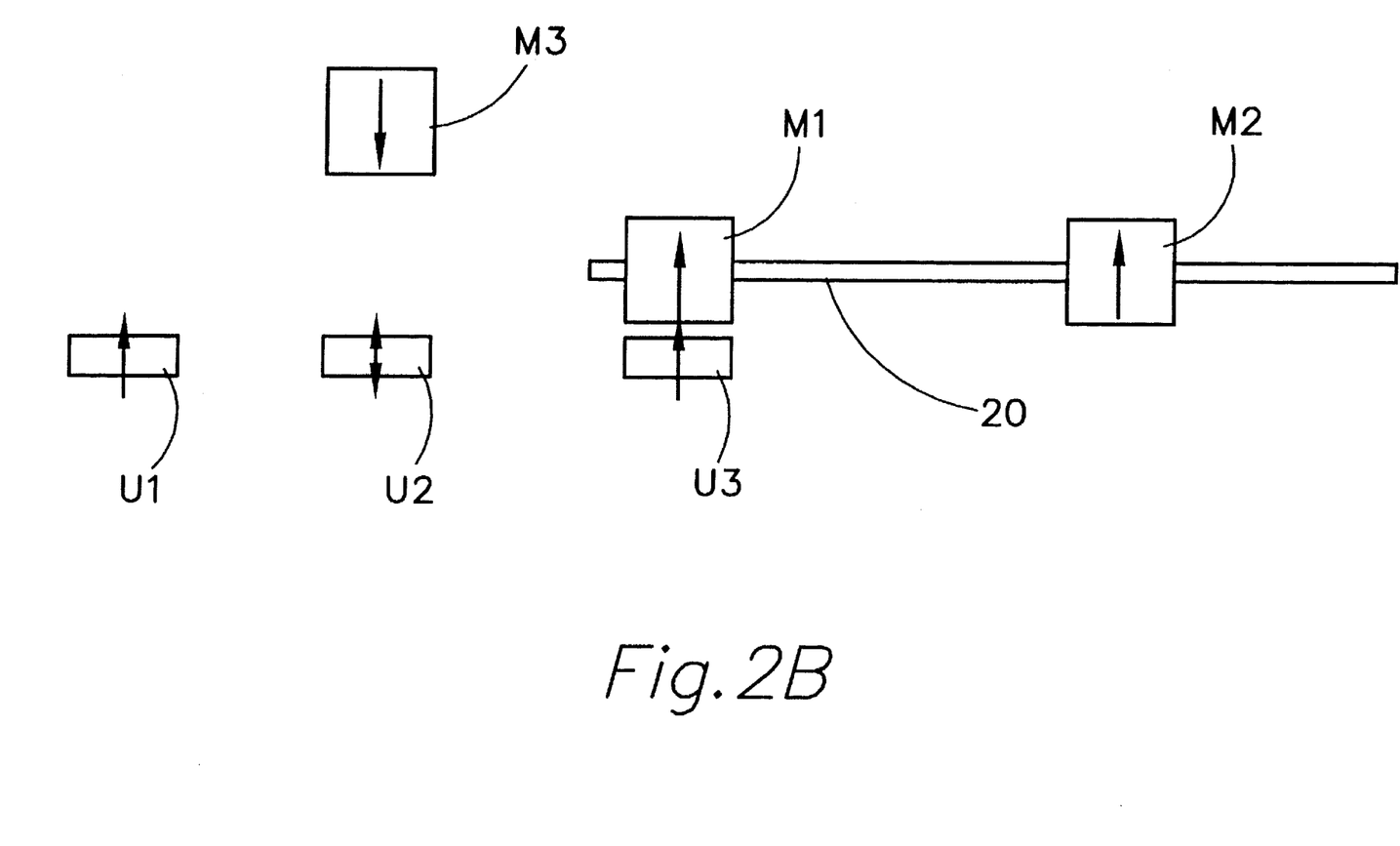

FIG. 2B illustrates the present invention after the key structure 20 has moved toward the left by a sufficient distance to place the first magnet M1 proximate the third magnetically sensitive device U3. Because of the effect of the first magnet M1 on the third magnetically sensitive device U3, its output will change and a low signal will be provided. The output from the three magnetically sensitive devices will then become "100".

Figure 2C:
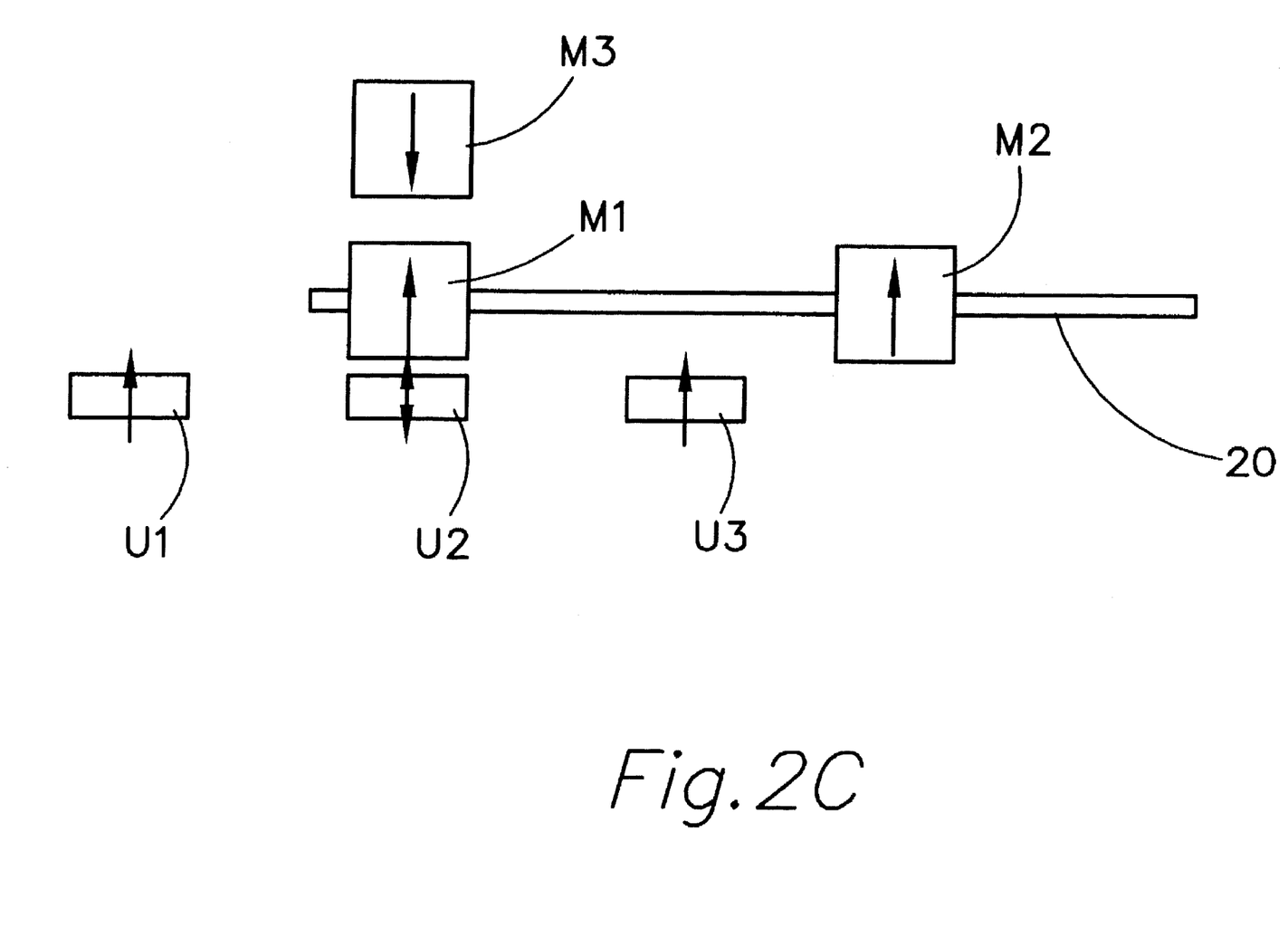

FIG. 2C illustrates the present invention after the key structure 20 has moved further along the path within the housing structure. This additional movement places the first magnet M1 at a position between the second magnetically sensitive device U2 and the third magnet M3. The opposite magnetic direction of the first and third magnets results in a high output from magnetically sensitive device U2 because of the canceling effect of the first and third magnets. As a result, the combined binary signal from the first, second and third magnetically sensitive devices is "111" when the key structure 20 is in the position shown in FIG. 2C.

Figure 2D:
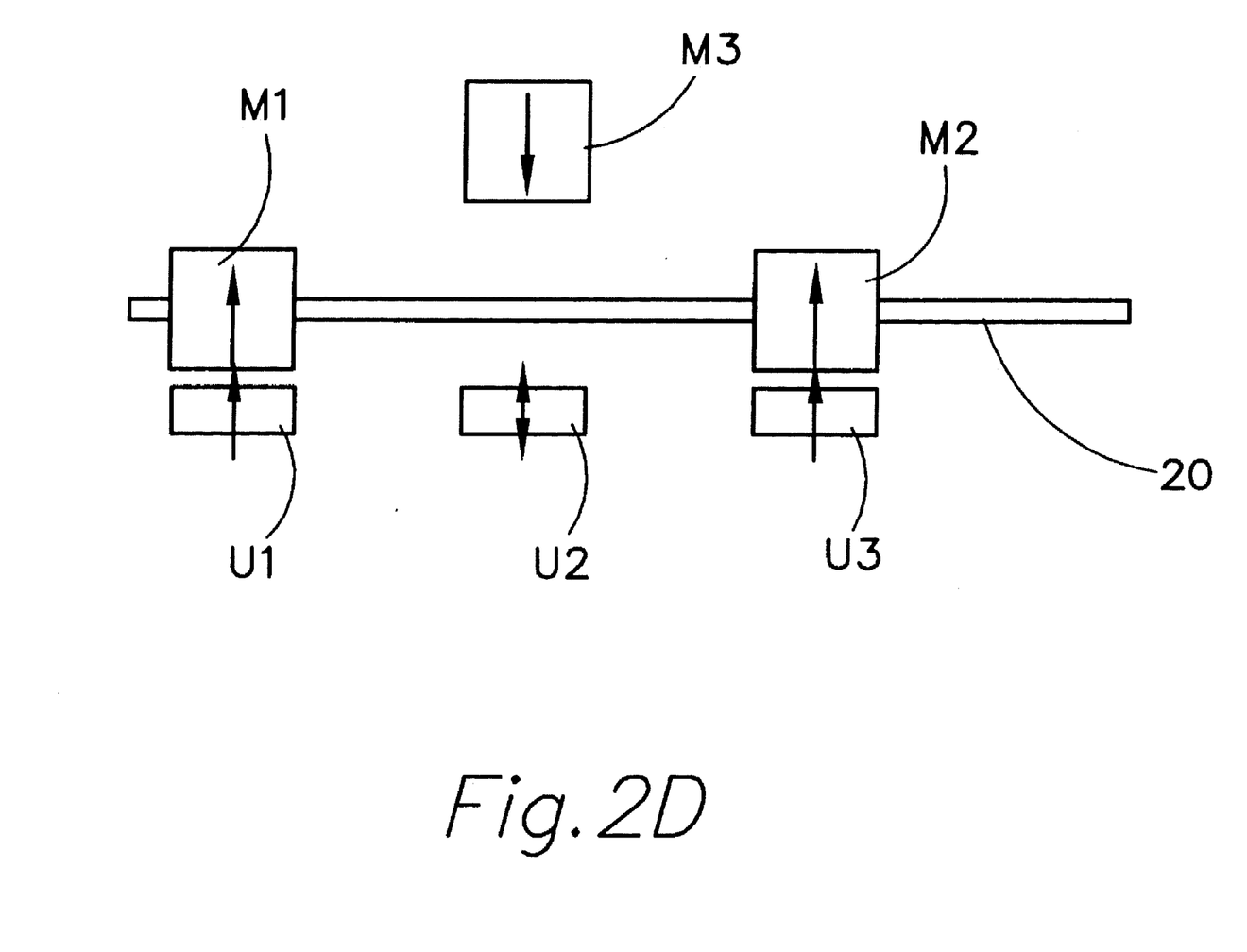

FIG. 2D illustrates the present invention when the key structure 20 is moved completely into its position within the housing structure. This position places the first magnet M1 directly over the first magnetically sensitive device U1 and places the second magnet M2 directly in position over the third magnetically sensitive device U3. As a result, the first and third magnetically sensitive devices are actuated and caused to provide a zero output. The presence of the third magnet M3 causes the second magnetically sensitive device U2 to provide a high output also. As a result, the binary output from the first, second and third magnetically sensitive devices is "000". With reference to FIGS. 2A, 2B, 2C and 2D, it can be seen that the sequential movement of the key structure 20 from the right toward the left into the housing structure results in sequential signals of "101", "100", "111" and "000". The decimal value of those binary signals is "5", "4", "7" and "0". This sequential progress can be monitored to determine the proper movement of the key structure as it enters the path provided within the housing structure.

Figure 3:
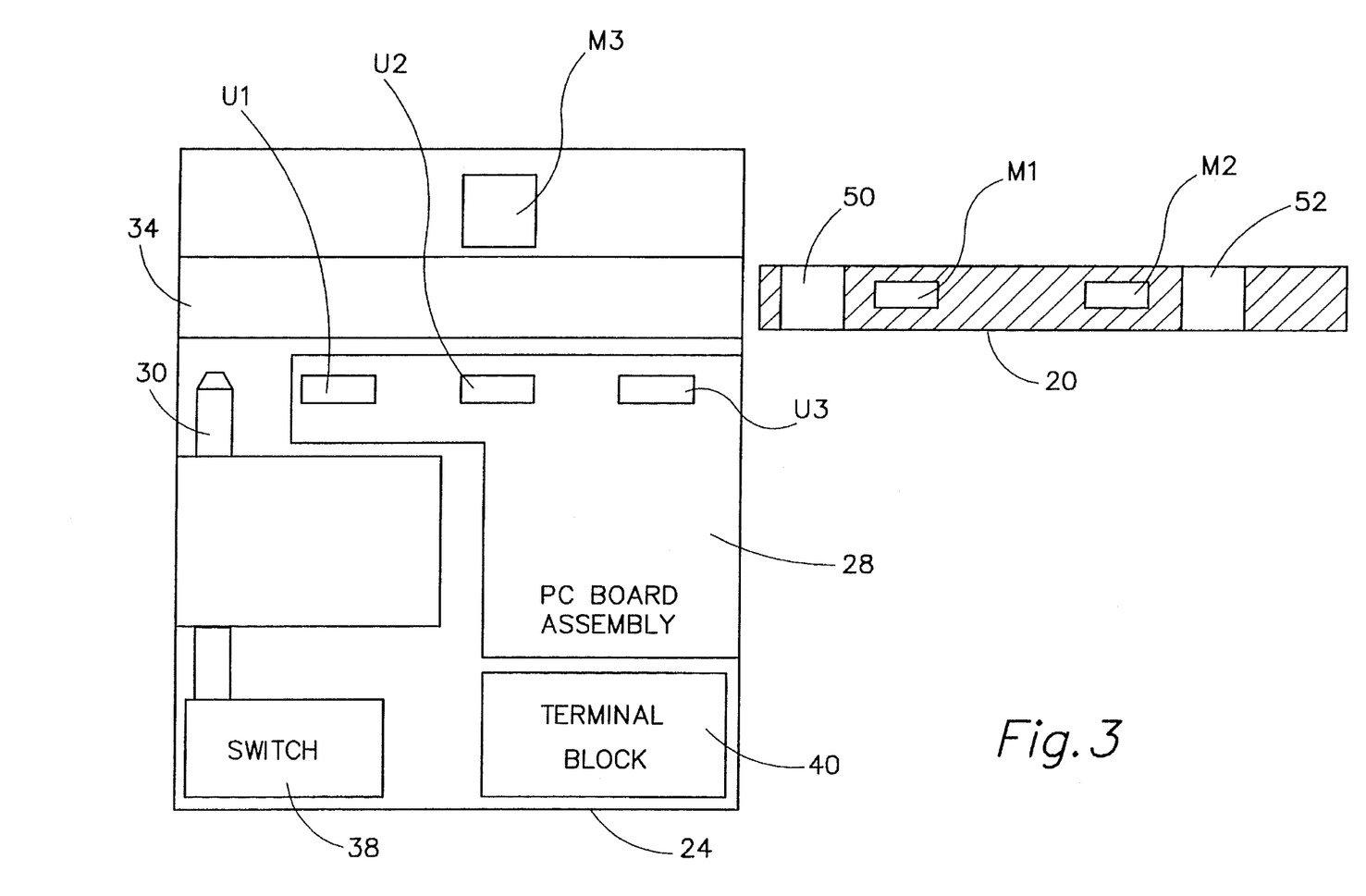
FIG. 3 shows the key structure and the housing structure of the present invention with certain internal components illustrated schematically.

FIG. 3 illustrates a schematic representation of the present invention in greater detail than the schematic illustrations of FIGS. 2A, 2B, 2C and 2D. In FIG. 3, the housing structure 24 is shown with the first U1, second U2 and third U3 magnetically sensitive devices contained therein. These magnetically sensitive devices are attached to a printed circuit board assembly 28 which is contained within the housing structure. Also shown in FIG. 3, a plunger 30 is provided to mechanically latch the key mechanism 20 within the housing structure when the key structure is in its proper position. The path 34 is shown extending into the housing structure 24 to permit the key structure 20 to pass therein. The movement of the plunger 30 can also be used to actuate a switch 38. In order to facilitate connection of the device shown in FIG. 3 to external equipment, a terminal block 40 is also provided.

With continued reference to FIG. 3, it can be seen that the first and second magnets, M1 and M2, are embedded within the key structure 20. It should be understood, however, that many other configurations are possible within the scope of the present invention in order to provide the movement of the first and second magnets with the key structure 20. The key structure 20 is shown having two openings extending therethrough. A first hole 50 and a second hole 52 is provided to permit passage of the plunger 30 through the body of the key structure 20. When the key structure 20 moves into the path 34 in the direction from right to left shown in FIG. 3, the plunger 30 can be inserted into hole 50 to lock the key structure 20 within the housing structure and prevent its movement out of the housing structure. If, on the otherhand, the key structure 20 is inserted into the path 34 in a direction from left to right from the opposite side of the housing structure 24, the plunger 30 can be inserted into hole 52 when the first and second magnets are in there proper place relative to the first, second and third magnetically sensitive devices. In order to maintain the same logic circuitry that is necessary to monitor the movement of the key structure in the manner described above, a means can be provided for switching the logical operation of the first and third magnetically sensitive devices, U1 and U3. This is a relatively simple manner and will permit the same components and circuitry to be utilized whether the key structure 20 is intended to be inserted from the right or from the left in FIG. 3. This permits bi-directional operation and greatly expands the flexibility of use of the present invention.

Figure 4:
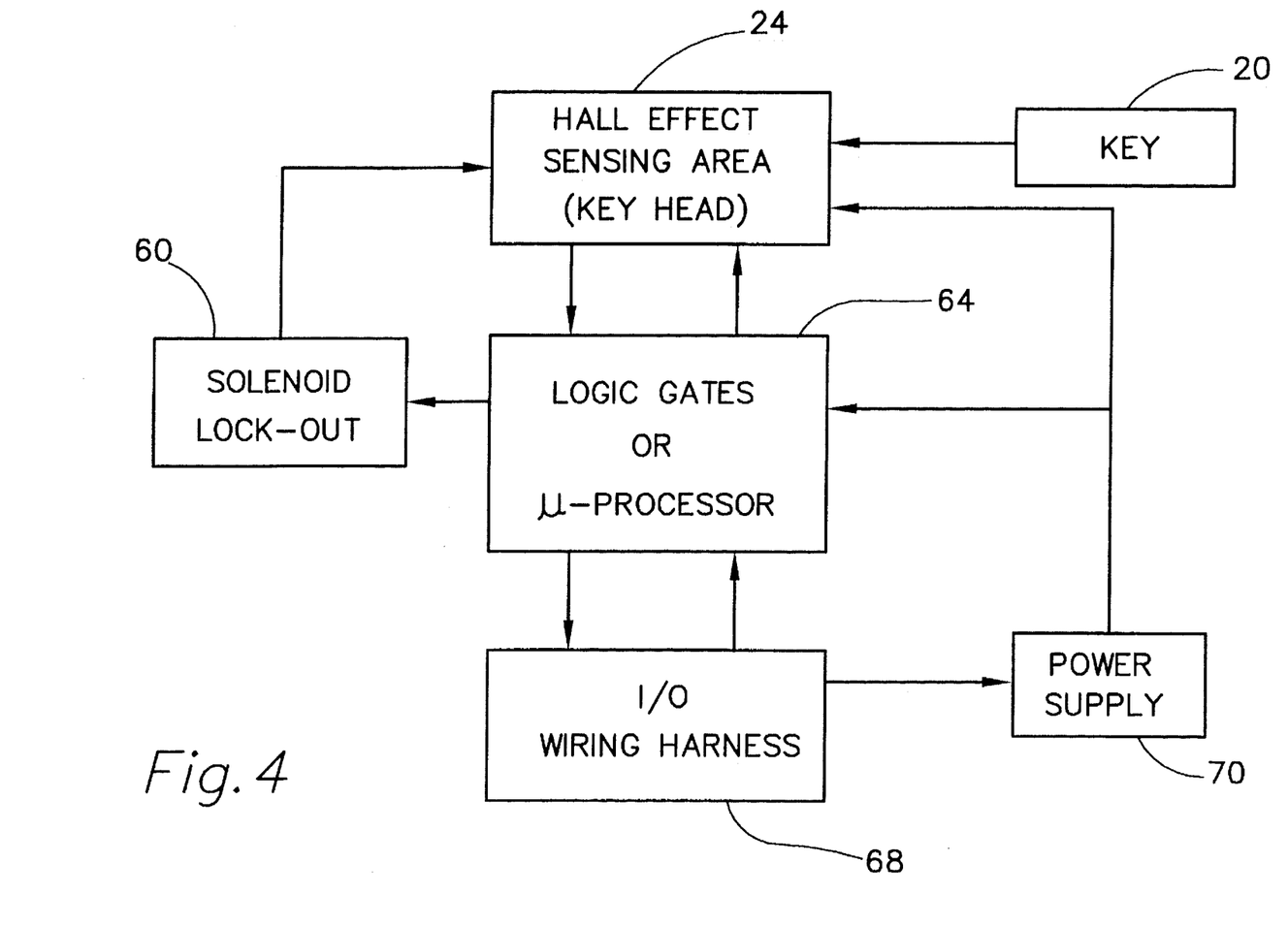
FIG. 4 shows a block diagram of the present invention.

FIG. 4 illustrates a schematic representation of the present invention which illustrates the housing structure 24 which provides a Hall effect sensing area, a key structure 20 and logic gates 64 or the microprocessor used to monitor the progress of the movement of the key structure relative to the housing structure. The input/output wiring harness 68 is provided to permit the present invention to be connected to external components and a power supply 70 is shown in FIG. 4 connected to the Hall effect sensing area and the logic gates or microprocessor 64. A solenoid lock out 60 is also shown.

Figure 5:
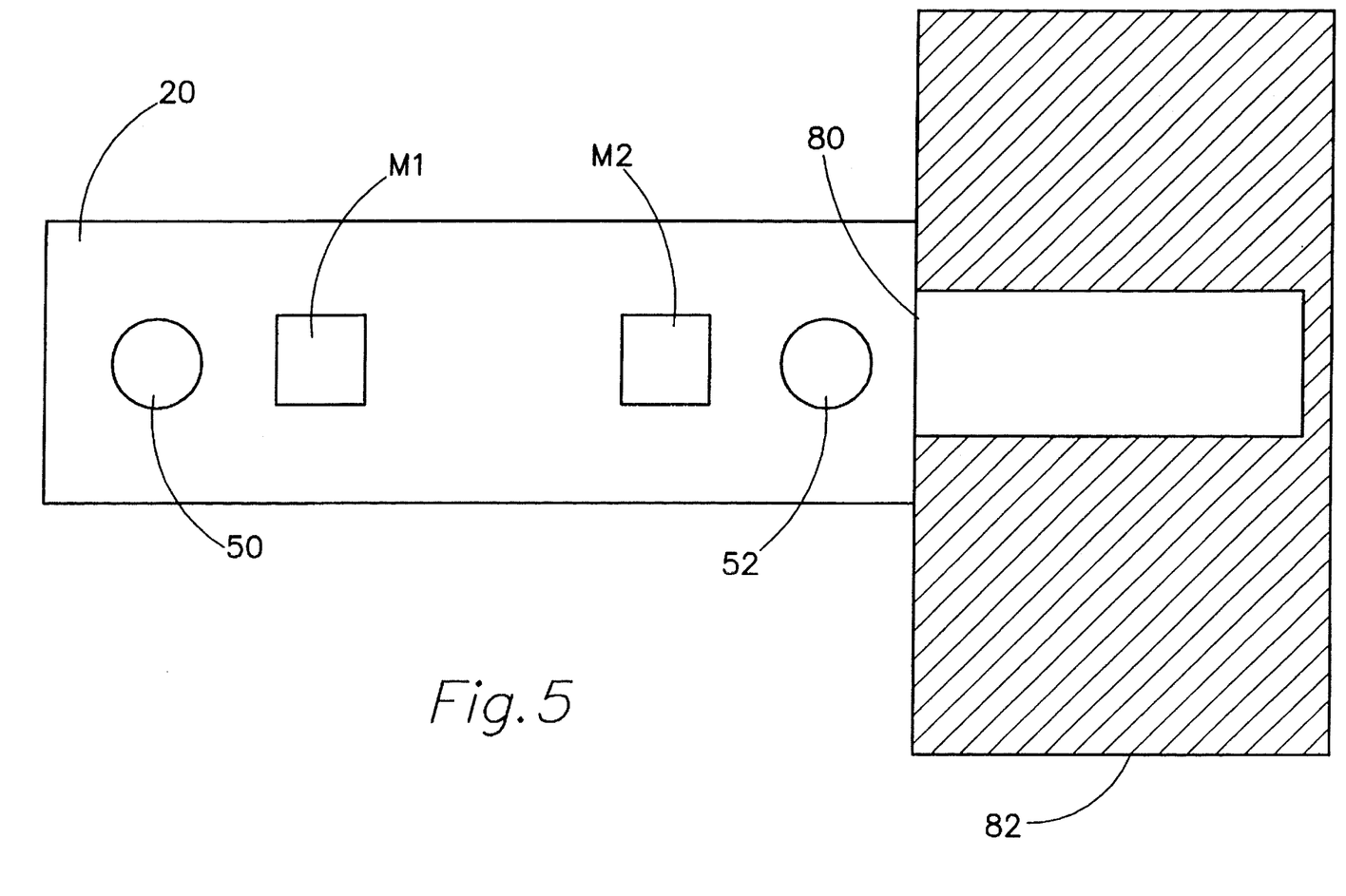
FIG. 5 shows the key structure of the present invention associated with a moveable object.

FIG. 5 illustrates the manner in which the key structure 20 could be attached to a moveable object. The key structure 20 can be provided with a tongue portion 80 that permits is to be rigidly attached to a moveable object 82. In typical applications, the moveable object 82 can be a protective door or enclosure surrounding a potential dangerous portion of a machine tool. The provision of two holes, 50 and 52, allow the key portion 20 to be inserted into the housing structure 24, along the path 34, in either of two opposite directions.

Figure 6:
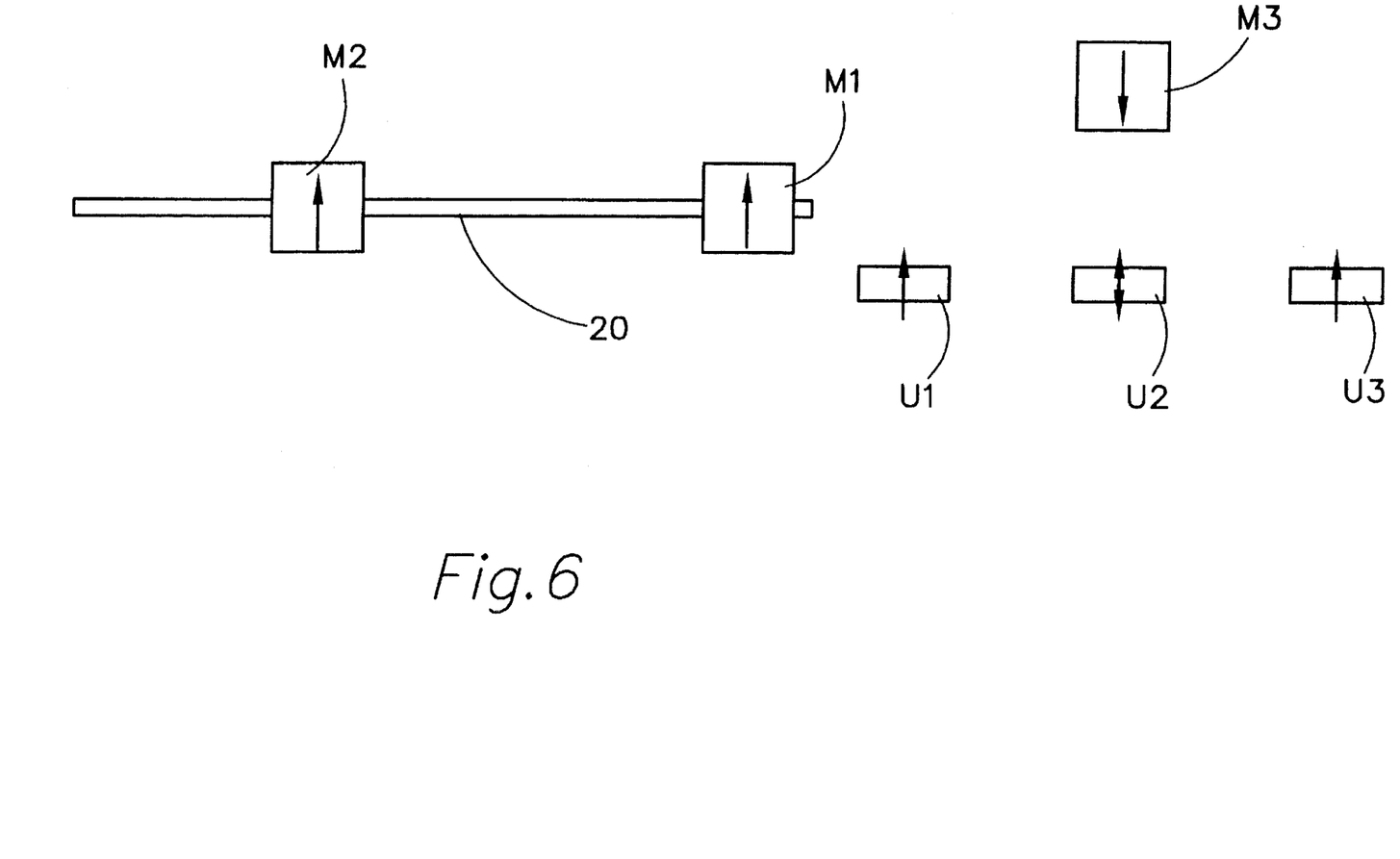
FIG. 6 shows an alternative relative position of the key structure and the housing structure of the present invention to permit its operation in an opposite direction.

FIG. 6 illustrates a schematic representation of the components of the present invention which shows the movement of the key structure 20 relative to the first, second and third magnetically sensitive devices in a direction from left to right. The illustration of FIG. 6 is essentially a mirror image of that shown in FIG. 2A. Reference to FIGS. 2A and 6 show that the present invention can be operated in either of two opposite directions in order to facilitate its use and expand its possible applications.

Figure 7:
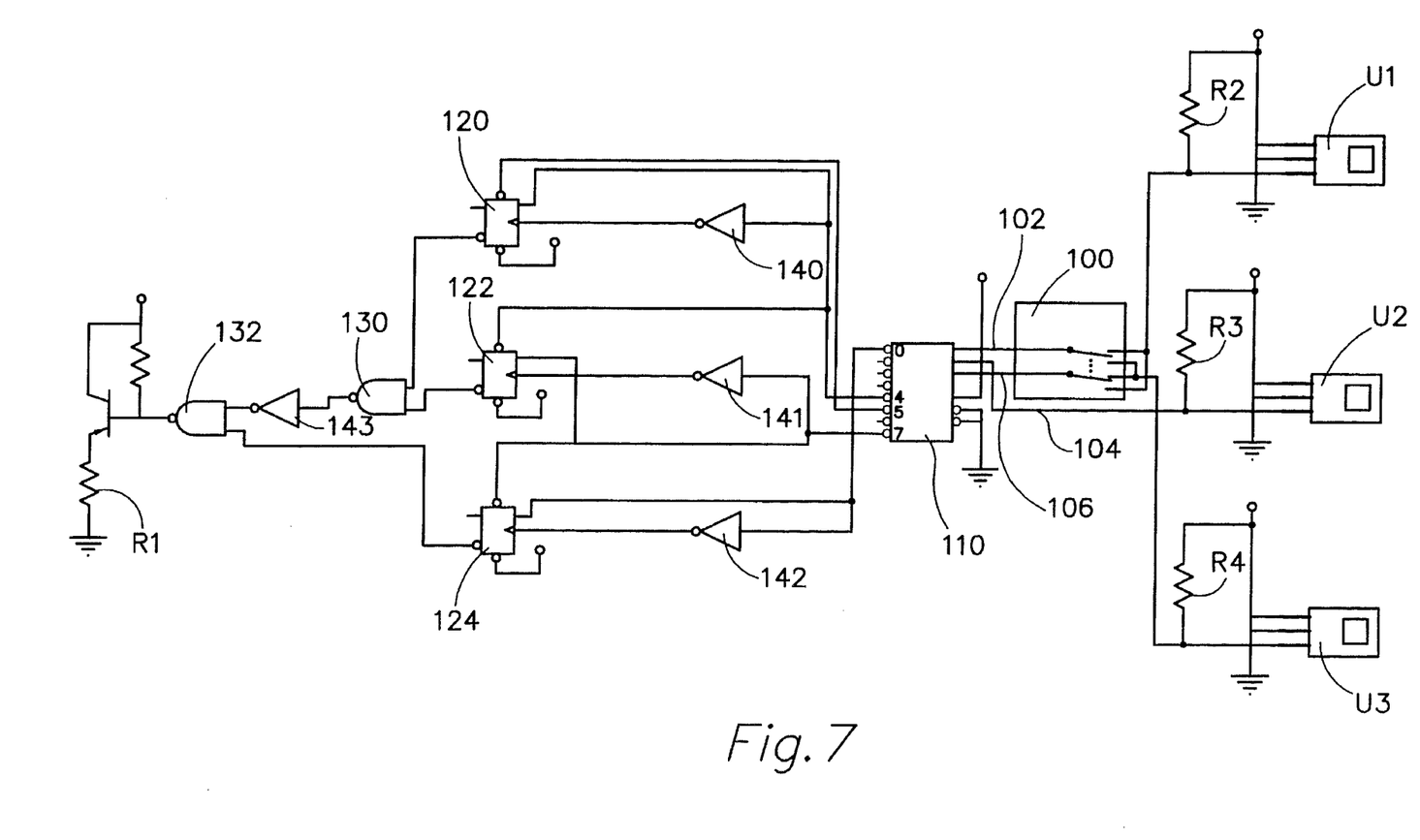
FIG. 7 illustrates a logic circuit that can be used in conjunction with the present invention.

FIG. 7 illustrates a circuit that permits implementation of the present invention with logic devices. The three magnetically sensitive components, U1, U2 and U3 are shown to the right side of FIG. 7. Switch 100 provides a means for interchanging the outputs of magnetically sensitive devices U1 and U3. This permits the present invention to be implemented regardless of the direction of the movement of key member 20 relative to the housing 24. If the switch 100 is in the first of its two possible positions, magnetically sensitive device U1 represents the least significant of the three binary digits described above. If, on the other hand, switch 100 is placed in the second of its two possible positions, magnetically sensitive device U3 becomes the least significant binary digit. The output signals from the magnetically sensitive devices are connected, on lines 102, 104 and 106, to a binary-to-decimal converter 110. Although many different types of converters are known to those skilled in the art, a particularly preferred embodiment of the present invention uses a binary-to-decimal converter that is identified by catalog reference number 4HC138A and is available in commercial quantities from the Motorola Corporation. The output of device 110 is one of eight possible values. The decimal values of zero, four, five and seven are connected as shown to the flip-flops, 120, 122 and 124. As can be seen, each of the signals are connected to the "D" input of an associated flip-flop and also connected, through an inverter, to the clock input of an associated flip-flop. In order to require the appropriate sequence of decimal progression that is described in detail above, the output of device 110 representing a decimal value of five is connected as an inverted "PRE" signal to flip-flop 120. The next expected sequential decimal output from device 110, which is a decimal four, is connected to the inverted "PRE" input of flip-flop 122 and, through an inverter, to the clock input of flip-flop 120. In addition, the decimal four output of device 110 is connected to the "D" input of flip-flop 120. The next sequential decimal value, which is seven, is connected to the "PRE" input of flip-flop 124 and, through an inverter, to the clock input of flip-flop 122. Finally, the decimal zero output of device 110 is connected to the "D" input of flip-flop 124 and, through an inverter to the clock input of flip-flop 124. The Q-bar outputs of flip-flops 120 and 122 are connected as inputs to NAND device 130. The output of NAND gate 130 is inverted and provided as an input to NAND gate 132. The other input NAND gate 132 is the Q-bar output of flip-flop 124. Resistor R1 represents a load that can be energized by the output of NAND gate 132 which, in effect, is the output of the circuit shown in FIG. 7.

With continued reference to FIG. 7, resistors R2, R3 and R4 are provided as pull-up resistors. Inverters 140–143 are used to invert the related signals as described above. The result of the circuit shown in FIG. 7 is that an output to load R1 results when the appropriate sequential signals of a decimal 5, a decimal 4, a decimal 7 and a decimal 0 are received in that appropriate order. If the key member is intended to enter the housing in the opposite direction, switch 100 can be used to interchange the logical position of magnetically sensitive devices U1 and U3 in the circuit.

Figure 8:
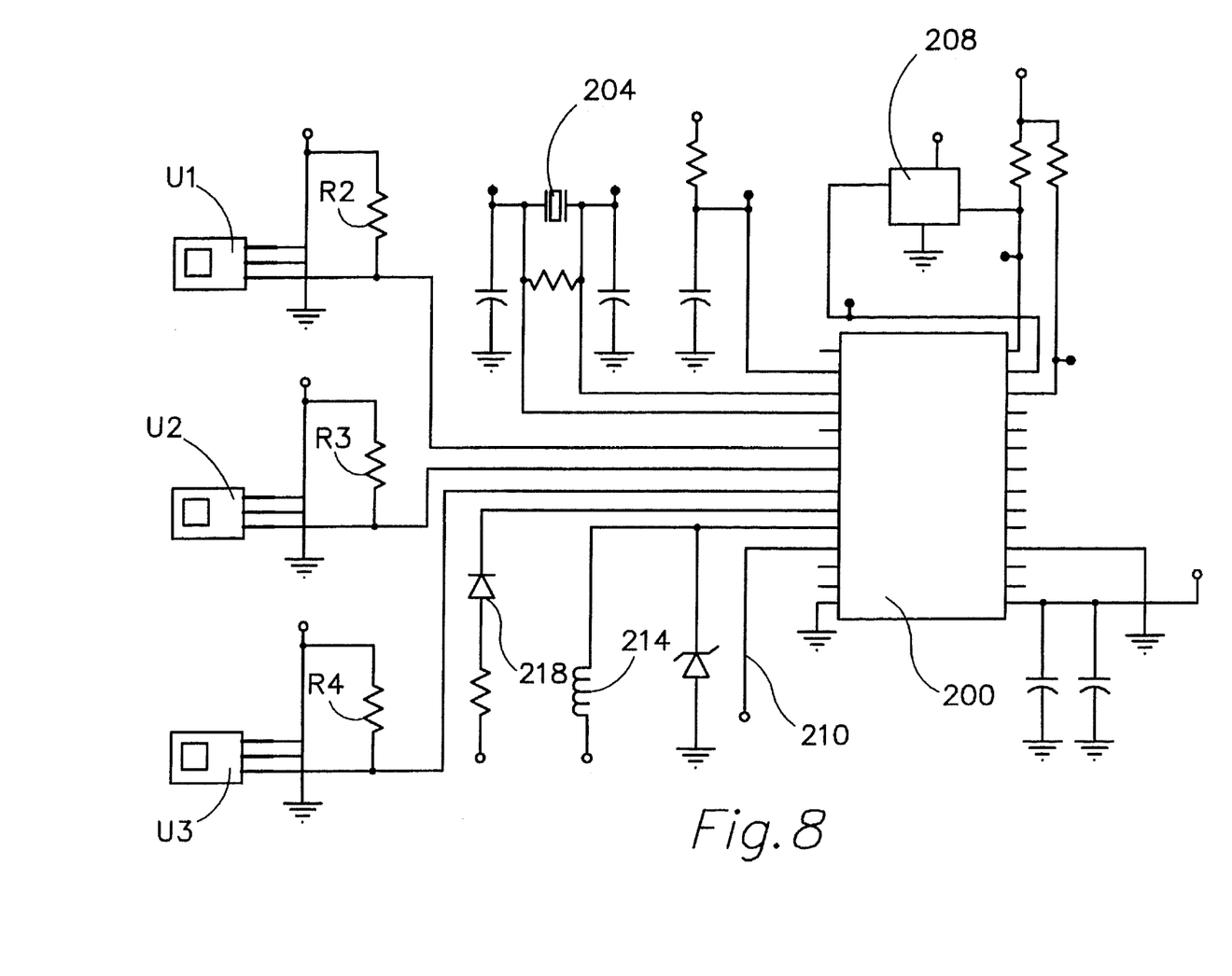
FIG. 8 shows a circuit in which a microprocessor can be used to monitor the movement of the key structure relative to the housing structure.

FIG. 8 shows an embodiment of the present invention that is particularly adapted to be used in conjunction with a microprocessor instead of the logic circuitry described above in conjunction with FIG. 7. The magnetically sensitive components, U1, U2 and U3, are connected as shown to inputs of a microprocessor 200. The microprocessor is provided with a clock signal from a crystal oscillator 204. A voltage regulator circuit 208 is also provided. Depending on the particular application of the present invention, the microprocessor 200 can be provided with an external data input line 210, means for energizing a solenoid 214 and means for providing an output indication 218. The solenoid 214 could be the actuation means that moves the pin 30 that is described above in conjunction with the FIG. 3.

With continued reference to FIG. 8, the microprocessor 200 can be one such as that which is identified as catalog number XC68HC705 that is commercially available from the Motorola Corporation.

Figure 9:
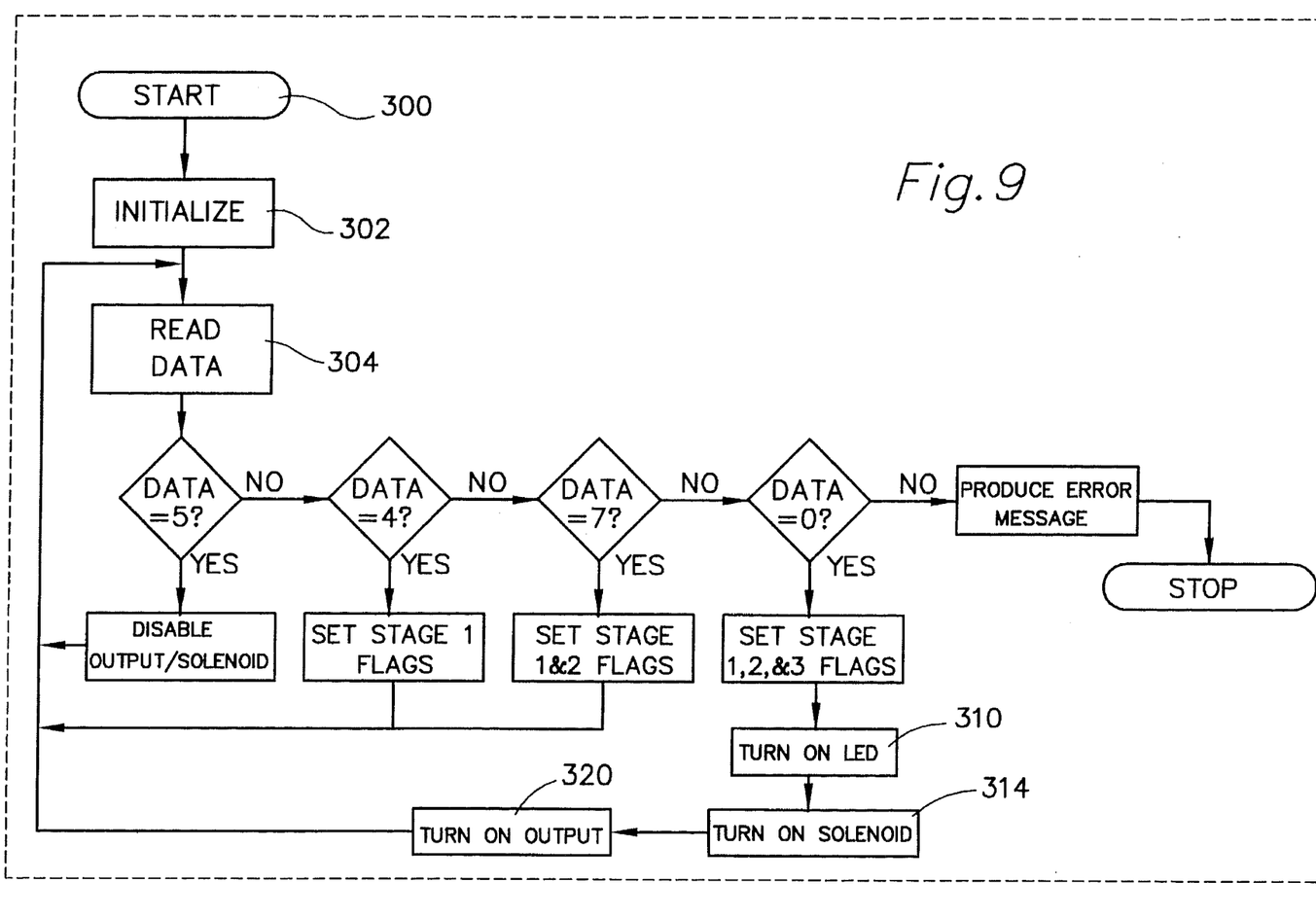
FIG. 9 shows an exemplary flow chart that could be implemented by a microprocessor used in conjunction with the present invention.

The microprocessor 200 shown in FIG. 8 could be used to implement a simplified program as represented by the flow chart shown in FIG. 9. Although FIG. 9 illustrates a particular flow chart, it should be clearly understood that many different logical sequences could be used to implement the present invention and the particular logical sequence shown in FIG. 9 is only intended to provide one possible means for implementing the use of a microprocessor in conjunction with the present invention. When the program is started, at functional block 300, it first initializes the various flags and data values. This is illustrated by functional block 302. The output signals from the three magnetically sensitive components, U1, U2 and U3, are read and the decimal value of this binary output is obtained. These operations are represented by functional block 304. If the decimal data is equal to five, the solenoid is disabled and the appropriate signals are provided in order to disable the operation of an associated machine with which the present invention is being implemented. If, on the other hand, the data is equal to four, a flag is set to represent the fact that the key is moving into the housing and is presently at stage one. When the decimal data equals seven, state one and two flags are set. Finally, when the data is equal to zero, stage one, two and three flags are set and the output signals are provided. For example, as represented by functional block 310 the output signal 218 is energized. In addition, as represented by functional block 314, the solenoid 214 is energized and an appropriate output is then provided as represented by functional block 320.

With continued reference to FIG. 8, it should be clearly understood that the flow chart is highly simplified and used only for the purpose of illustrating one possible sequence of checks and logical procedures that could be used in the microprocessor 200 described above in conjunction with FIG. 7. Many additional checks could be provided in the flow chart in order to make sure that momentary reversals of the key's direction are able to be handled properly. In other words, as the key is moving into the housing, it may momentarily stop and reverse direction before proceeding again in the proper direction. This could possibly create a sequential series of decimal values that is slightly different than the ones anticipated and described above. The software could be easily designed in order to accommodate these possible apparitions. Regardless of the many different versions of software that can be used in conjunction with the present invention, it should be understood that the primary junction of the software is to assure that the key member 20 moves in the proper direction through the housing member 24. In addition, following the proper sequential movement of the key member into the housing structure, the microprocessor must also determine that the key is in its proper final position prior to permitting an associated machine to operate. It is at this final position that the pin is inserted through a hole in the key to lock it into its relative position within the housing structure. Many different types of computer programs can be implemented to assure that the key is in its proper position. The flow chart shown in FIG. 9 is merely one example of this type of programming logic.

Although the present invention has been described with particular specificity and illustrated to show one of its particularly preferred embodiments, it should be understood that many other embodiments are within its scope.

The embodiments of the invention in which an exclusive property or right is claimed are defined as follows:

1. A closure sensing apparatus, comprising:

a housing structure having first, second and third magnetically sensitive devices disposed therein, said first, second and third magnetically sensitive devices being aligned along a first axis, said housing structure being shaped to form a first path into said housing structure;

a key structure having first and second magnets attached thereto, said first and second magnets being aligned along a second axis, said key structure being shaped to be received within said housing structure along said first path, said first path being parallel to said first axis and said second axis;

means for determining a predetermined relative position between said key structure and said housing; and means for monitoring the sequential movement of said key structure relative to said housing structure and along said first path.

2. The apparatus of claim 1, further comprising:

a third magnet disposed proximate said first path within said housing structure.

3. The apparatus of claim 1, wherein:

said first, second and third magnetically sensitive devices are Hall effect components.

4. The apparatus of claim 1, wherein:

said housing structure is configured to permit said key structure to move along said first path in a first direction and a second direction, said first and second directions being opposite to each other.

5. The apparatus of claim 4, further comprising:

means for exchanging the logical operation of said first and third magnetically sensitive devices within an electronic circuit to permit the movement of said key structure to be monitored in both of said first and second directions.

6. The apparatus of claim 1, further comprising:

means for preventing movement of said key structure relative to said housing structure when said key structure is disposed in a preselected position relative to said housing structure.

7. A closure sensing apparatus, comprising:

a housing structure having first, second and third magnetically sensitive devices disposed therein, said first, second and third magnetically sensitive devices being aligned along a first axis, said housing structure being shaped to form a first path into said housing structure;

a key structure having first and second magnets attached thereto, said first and second magnets being aligned along a second axis, said key structure being shaped to be received within said housing structure along said first path, said first path being parallel to said first axis and said second axis;

means for determining a predetermined relative position between said key structure and said housing;

a third magnet disposed proximate said first path within said housing structure; and means for monitoring the sequential movement of said key structure relative to said housing structure and along said first path.

8. The apparatus of claim 7, wherein:

said first, second and third magnetically sensitive devices are Hall effect components.

9. The apparatus of claim 7, wherein:

said housing structure is configured to permit said key structure to move along said first path in a first direction and a second direction, said first and second directions being opposite to each other.

10. The apparatus of claim 9, further comprising:

means for exchanging the logical operation of said first and third magnetically sensitive devices within an electronic circuit to permit the movement of said key structure to be monitored in both of said first and second directions.

11. The apparatus of claim 7, further comprising:

means for preventing movement of said key structure relative to said housing structure when said key structure is disposed in a preselected position relative to said housing structure.

12. A closure sensing apparatus, comprising:

a housing structure having first, second and third magnetically sensitive devices disposed therein, said first, second and third magnetically sensitive devices being aligned along a first axis, said housing structure being shaped to form a first path into said housing structure;

a key structure having first and second magnets attached thereto, said first and second magnets being aligned along a second axis, said key structure being shaped to be received within said housing structure along said first path, said first path being parallel to said first axis and said second axis;

means for determining a predetermined relative position between said key structure and said housing;

a third magnet disposed proximate said first path within said housing structure; and means for monitoring the sequential movement of said key structure relative to said housing structure and along said first path.

13. The apparatus of claim 12, wherein:

said first, second and third magnetically sensitive devices are Hall effect components.

14. The apparatus of claim 12, wherein:

said housing structure is configured to permit said key structure to move along said first path in a first direction and a second direction, said first and second directions being opposite to each other.

15. The apparatus of claim 14, further comprising:

means for exchanging the logical operation of said first and third magnetically sensitive devices within an electronic circuit to permit the movement of said key structure to be monitored in both of said first and second directions.

16. The apparatus of claim 12, further comprising:

means for preventing movement of said key structure relative to said housing structure when said key structure is disposed in a preselected position relative to said housing structure.

* * * * *